United States Patent [19]
Kirlin et al.

[11] Patent Number: 5,976,928
[45] Date of Patent: Nov. 2, 1999

[54] CHEMICAL MECHANICAL POLISHING OF FERAM CAPACITORS

[75] Inventors: Peter S. Kirlin; Peter C. Van Buskirk, both of Newtown, Conn.

[73] Assignee: Advanced Technology Materials, Inc., Danbury, Conn.

[21] Appl. No.: 08/975,366

[22] Filed: Nov. 20, 1997

[51] Int. Cl.$^6$ .................. H01L 21/70; H01L 21/8242
[52] U.S. Cl. .................. 438/240; 438/3; 438/387; 438/396
[58] Field of Search ................ 438/240, 3, 387, 438/396, 386, 388, 397, 398, 399, 239, 243, 244, 245, 253, 254, 255, 256

[56] References Cited

U.S. PATENT DOCUMENTS

| | | | |
|---|---|---|---|
| 5,275,974 | 1/1994 | Ellul et al. | 437/203 |
| 5,318,927 | 6/1994 | Sandu et al. | 437/225 |
| 5,330,931 | 7/1994 | Emesh et al. | 437/60 |
| 5,340,370 | 8/1994 | Cadien et al. | 51/308 |
| 5,354,712 | 10/1994 | Ho et al. | 437/195 |
| 5,392,189 | 2/1995 | Fazan et al. | 361/305 |
| 5,394,000 | 2/1995 | Ellul et al. | 257/301 |
| 5,516,346 | 5/1996 | Cadien et al. | 51/308 |
| 5,527,423 | 6/1996 | Neville et al. | 156/636.1 |
| 5,566,045 | 10/1996 | Summerfelt et al. | 361/321.1 |
| 5,614,444 | 3/1997 | Farkas et al. | 437/225 |
| 5,627,094 | 5/1997 | Chan et al. | 438/253 |
| 5,639,697 | 6/1997 | Weling et al. | 437/225 |
| 5,661,064 | 8/1997 | Figura et al. | 438/396 |
| 5,691,571 | 11/1997 | Hirose et al. | 257/751 |
| 5,696,017 | 12/1997 | Ueno | 437/60 |
| 5,741,722 | 4/1998 | Lee | 437/60 |
| 5,786,259 | 7/1998 | Kang | 438/396 |
| 5,801,079 | 9/1998 | Takaishi | 439/396 |
| 5,843,818 | 12/1998 | Joo et al. | 438/240 |

FOREIGN PATENT DOCUMENTS

| | | |
|---|---|---|
| 581475 A1 | 2/1994 | European Pat. Off. . |
| 606758 A1 | 7/1994 | European Pat. Off. . |
| WO95/08846 | 3/1995 | WIPO . |

*Primary Examiner*—Olik Chaudhuri
*Assistant Examiner*—Daniel Mao
*Attorney, Agent, or Firm*—Steven J. Hultquist; Oliver A.M. Zitzmann

[57] ABSTRACT

A method of fabricating a ferroelectric capacitor structure by sequentially depositing a bottom electrode layer, a ferroelectric layer and a top electrode layer on a base structure, optionally with deposition of a layer of a conductive barrier material beneath the bottom electrode layer, to form a capacitor precursor structure, and planarizing the capacitor precursor structure by chemical mechanical polishing to yield the ferroelectric capacitor structure, e.g., a stack capacitor or trench capacitor. The process is carried out without dry etching of the electrode layers or dry etching of the ferroelectric layer, to yield ferroelectric capacitors having a very small feature size, as for example between 0.10 and 0.20 $\mu$m.

69 Claims, 5 Drawing Sheets

CHEMICAL MECHANICAL POLISHING OF FERAM CAPACITORS

BACKGROUND OF THE INVENTION

1. Field of the Invention

The present inventi on relates to a chemical mechanical polishing (CMP) method having applicability to the manufacture of ferroelectric random acc ess memory capitors.

2. Description of the Related Art

There is currently a major effort in semiconductor companies, world-wide, to commercialize high dielectric constant and ferroelectric thin films in advanced DRAMs and ferroelectric random access memories (FeRAMs), respectively. These materials include $BaSrTiO_3$ (hST) for DRAMs and $PbZrTiO_3$ (PZT) and $SrBi_2Ti_2O_9$ (SBT) for FeRAMs.

It is well known that these materials require electrodes made from noble metals or noble metal alloys such as Pt, Ir, $IrO_2$, Pt-Ru, etc., and sub-micron patterning of both the noble metals and the ferroelectric films is very difficult because of the absence of volatile products for the elemental constituents. State-of-the-art dry etching processes for Pt and Ir are known to have fundamental difficulties due to the predominantly physical (not chemical) mechanism for material removal, resulting in formation of unwanted structures (sometimes called "ears") at the edges of the electrodes.

Besides the difficulties in patterning sub-micron capacitors of this type, for high memory density it is also important to fabricate the capacitors directly over a conductive plug to contact transistors, in order to reduce the area of the memory cell. This geometry (capacitor over plug) is also known as a stack capacitor configuration. For the conventionally employed materials, e.g., polysilicon or tungsten for the plug, a barrier layer is needed to prevent oxidation of the plug and diffusion of the plug material (p-Si or W) through the noble metal bottom electrode. To overcome such problems, it is desirable to use geometric means to protect the plug/barrier/electrode interfaces from exposure to oxidation.

An alternative to the stack capacitor is a trench capacitor, which utilizes an enhanced surface area capacitor on the walls of a trench that is etched directly into doped silicon. In such trench capacitors, the bottom electrode contact is not to a conductive plug (p-Si or W), but to the conductive substrate itself, and the requirements for the baprier are similar to the stack onfiguration. In trench capacitor architecture, the memory cell's transistors are formed on the surface of wafer adjacent to the top of the trench capacitor.

Ferroelectric capacitors planarized using chemical mechanical polishing are also more versatile for monolithic integration of ferroelectric memory or dynamic random access memory (DRAM) with logic IC ("embedded memory"), since the 4–6 levels of metal needed for logic IC's places additional demands on the planarity of the underlying structures, compounded by the need for surface flatness in high resolution microlithography, in ord er to stay within the aligner's specified depth of focus.

An additional constraint is economic. It is essential to minimize the number of processing steps as much as possible, and to achieve the highest possible yield for IC devices that are manufactured.

By way of background to the ensuing description of the present invention, a description is set out below of machines used in conventional CMP process operations, polishing pads and slurry compositions used in chemical mechanical processing.

Three types of mechanical, rotating actions are typically employed in conventional CMP machines. One such type has a rotating wafer carrier. Another revolves the abrasive pad. A third type spins both the wafer carrier and the abrasive pad simultaneously. The polishing pad is presoaked and continually rewet with a slurry consisting of various particles suspended in a solution. The polishing particles range in size from 30 to 1100 nanometers. The suspension solution generally comprises a diluted base or acid for polishing oxide and metals respectively. Upon completion of the planarization, the wafers go through a post-CMP clean process in which the residual slurry, ground oxide/metal particles, and other potential contaminants are removed. Most IC manufacturers use a combination of deionized (DI) water rinses and nitrogen air drying to accomplish the post-CMP decontamination.

The two most common uses of CMP are oxide and metal (tungsten) plug planarization. The two most essential components of the CMP process are the slurry and polishing pad.

The polishing pad, generally a polyurethane-based material, performs two primary functions. The polymeric foam cell walls of the pad aid in removal of reaction products at the wafer surface and the pores within the pad assist in supplying slurry to the pad/wafer interface.

Progressively more research efforts have focused on further understanding empirical results of the intimate contact between the pad and the pre-planarization surface. Several "peculiarities" were originally noticed in the material removal rate (RR) as a function of time, pressure, and velocity. Many CMP users noticed that the RR decreased tremendously as high throughput processes were attempted. Research showed that deformation of the pad resulted from the brittle, hard surface of the IC surfaces. The asperity of the pads, or surface roughness due to the type of pad material, the density of "pockets", and abrasive characteristics, was found to decline due to pad layer removal. To alleviate this problem, called "glazing", the pad was conditioned after an experimentally determined amount of time, or wafer runs. The conditioner was composed of a base material (metal), a diamond grit (for cutting), and a grit-bonding material (Ni plating). The plating bonded the diamond grit to the base material. The conditioner then effectively removed the top layer of the pad until excess, non-desired particles were removed and the nominal surface characteristics of the pad were present. Although this approach allowed the same pads to be used for an extended amount of time, it also resulted in other complications.

Specifically, the physical bonding of the diamonds and base material ruptured relatively easily during the conditioning process. New methods of bonding were pursued as well as enhanced post-conditioning cleaning. When the diamonds were chemically bonded to the base material, the additional strength made grit detachment less prominent. The new bonding method allowed a factor of ten more wafers to be polished with the same conditioning pads as compared to the number that were able to be polished with the physically grit-bonded pads.

Pad conditioning plays a larger role in planarization of oxide than in planarization of metals since metals tend to have a higher degree of hardness in relation to the pad material.

To aid in transporting slurry to the pad/wafer interface, new pad structures have been designed. Karaki-Doy and other developers have designed polishing pads with continuous grooves in concentric ellipses across the entire pad. This structure was found to deliver the slurry more uniformly to the interface and to augmented the amount of debris removal resulting from the CMP process. Most conventional pads consist of "pockets" within the polyurethane which are prone to clogging due to residual debris discharged during the process. Consequently, Karaki-Doy and other developers placed the grooves in the surface of the pad, and noticed an increased longevity in the conditioning-to-conditioning life of their pads over common types of pads.

Another key element in the amenabilty of the pad to planarize uniformly is the IC device density and relative layer heights (critical dimensions, CD) of the structure undergoing CMP. CMP tends to polish smaller, individual features faster than larger, more densely packed features. The oxide removal rate over features 15 mm in width is 60–80% greater than the oxide removal rate over features four times that width. Denser or larger features tend to distribute applied load pressure over a larger area than smaller features. Since the removal rate and pressure are directly related in the direct contact mode, the removal rate decreases since the effective, local pressure decreases. The same principles apply when adjacent layers have a larger height contrast. "Taller" features will be planarized quicker, depending on other dimensions and the proximity to other devices.

The foregoing factors add complexity to IC design. If IC manufacturing processes require CMP procedures, device dimensions and density are critical and require close scrutiny.

The slurry composition used in CMP comprises abrasive particles suspended in a solvent, or solution. Key factors in the effectiveness of the slurry include particle size and shape, solution pH, weight percent solids of the slurry, the quantity of the slurry delivered, and the reaction time involved.

The purpose of the slurry is simple, yet understanding and modeling all the mechanical and chemical reactions involved is extremely difficult. Essentially, the surface of the material being polished is chemically altered to a softer composition which is then mechanically removed by the pad and slurry abrasives. Thus, the slurry provides both chemical and mechanical forces in the CMP process. Oxide slurries are usually KOH— or NH$_4$OH-based with a fumed silica abrasive and a high pH. Metal slurries are relatively new and largely experimental, yet the most common are ferric nitrate with an alumina abrasive and low pH. Some polysilicon and polyimide slurries exist, but are still in the prototype and developmental stages.

To date, most of the research devoted to development of slurry compositions has focused on oxide slurries instead of metal slurries. Due to the numerous desirable characteristics of tungsten plugs, more attention is being directed to development of selective metal slurries. IBM has developed metal slurries with a tungsten:oxide selectivity of 120:1. This type of planarization is essential to the fabrication of multilevel metals and interlevel connects. Ideally the slurries investigated will produce high removal rates, high selectivity, local uniformity, and good planarity. Since "perfect" slurries do not currently exist, inevitable trade-offs have made in evolving acceptable commercial slurry formulations.

Due to the chemical nature of CMP, various studies have evaluated the influence of differing amounts of slurry introduced at the wafer/pad interface. In the case of oxide slurries, it is believed that the water in the solution reacts with the silicon oxide in the reaction as follows $(—Si—O—Si—)+H_2O=>2(—Si—OH)$ This equation shows the base portion of the entire, repetitive chemical structure (. . . —Si—O—Si—Si—O—Si— . . . , OH—Si— . . . —Si—OH) for simplicity. The reaction at the interface primarily occurs between molecules on the surface of the wafer and the silica particles in the slurry, since water has a low diffusivity in silicon oxide. Increasing the temperature directly increases the removal rate since the diffusivity of the water rises (specifically the diffusion constant of water in oxide). The most effective pH levels for oxide planarization lie between 9.7 and 11.4.

In the case of metal slurries, the composition is even more critical. Typical slurries incorporate an oxidizer or naturally dissolved oxygen additives to adjust pH levels, and either alumina or colloidal silica abrasives. The oxidizer changes the oxidation state of the metal and consequently produces metal ions. The top oxidized metal layer is more brittle and easily removed with the embedded abrasive particles. If the oxidation potential is too aggressive or the resulting metal compound too soluble, metal corrosion can occur as a result of wet etching. Alloys, galvanic actions, and precise oxidation states (oxidizers) are employed to slow down wet etching and limit the metal corrosion.

Two other key issues relating to the choice of slurries deal with post-CMP clean-up and the introduction of mobile ions to the wafer. Depending on the chemical reaction, oxide slurries can introduce various contaminants to the wafers surface. In terms of particle sizes, KOH-based slurries introduce a larger quantity of 2000 Angstrom particles than do the NH$_4$OH slurries. That difference translates into a higher probability of scratches (e.g., up to 7 times greater, according to some studies) on the wafer surface when using KOH slurries. NH$_4$OH slurries also produce a lower concentration of mobile ions than KOH-base slurries, and leave residual films that are easier to remove than the residue from KOH slurries. Environmentally, however, KOH-base slurries afford advantages over NH$_4$OH slurries. No ammonia smell exists when using KOH slurries, KOH slurries are less prone to settle in cleaning tanks and CMP machines, and KOH slurries are more stabile in terms of pH, and less temperature dependent than NH$_4$OH slurries.

Although CMP has revolutionized global planarization technology, some significant problems exist. One of the major difficulties is in-situ measuring of the amount of material removed form the wafer's surface. Due to inaccurate models, many results of CMP machines are difficult to reproduce and the machines themselves do not exhibit the ability for precise process control. This also leads to difficulty in analyzing feedback, or using in-situ measurements, to make adequate and appropriate process alterations to alleviate process complications. Some CMP slurry analyzers have been designed to measure and detect particle sizes in order to ascertain the abrasive characteristics of slurries more accurately. A few endpoint detection devices, like a stylus profiler, have been developed to monitor removal rates as well. Such efforts will aid in more precisely controlling the entire CMP process, but the analysis techniques and instruments have not been developed to a state of high commercial precision.

Thus, commercial CMP is the focus of substantial development effort, but in essence it continues to comprise the simple unit operations of:

1. reaction of an exposed layer of material (e.g., an insulating inorganic metal oxide and/or noble metal) to produce a wafer-adhered material whose hardness is less than the hardness of the abrasive and whose adhesion to the substrate is less than the original pre-reaction layer; and 2. removal from the substrate of the aforementioned reaction product material using a polishing slurry (abrasive medium).

Illustrative CMP slurry compositions (by principal reaction type) for insulating inorganic metal oxides include the compositions set out below:

A. Acidic or basic aqueous solution:

| | |
|---|---|
| HCl, $H_2SO_4$ | 0.01M or greater |
| KOH, NaOH, $NH_4OH$ | 0.01M or greater |

The art has directed improvements to alkali-containing solutions via aqueous or alcohol solutions of fluorinated silicon oxide particles, specifically the use of $H_2SiF_6$.

The slurry composition comprises $Al_2O_3$ and/or $SiO_2$ aqueous solution.

B. Oxidizing agent (with reduction potential, Eo, greater than IV):

| | |
|---|---|
| $H_2O_2$ | 35 vol. % or greater |
| nitrates, chromates, permagnates, $O_3$ and $F_2$ | |

The slurry composition comprises $Al_2O_3$ and/or $SiO_2$ aqueous solution.

C. Halogenated or psuedohalogenated material (in inert atmosphere):

| | |
|---|---|
| $POCl_3$, $SOCl_2$ | 100% or combined with a dry solvent (solvents: toluene, ethers, ketones, DMSO, etc.) |
| $P(SCN)_3$, $(SCN)_2$, | 20–100 vol. % |
| $S(SCN)_2$, | |
| $Hg(NCS)_2$, | |
| $Hg(NCO)_2$, | |
| AgNCO, | |
| $CH_3NCO$, | |
| $C_6H_5NCO$, | |
| BrCN | |

The slurry comprises a non-aqueous halogenated or pseudohalogenated reactant, and preferably includes a liquid organic ligand precursor (e.g., cyclic, acyclic, polycyclic, or aromatic compounds) which upon reaction with the halogenated or pseudohalogenated material form a metal-organic coordination complex which is heterocyclic.

The occurrence of dishing or polishing flaws, particularly with the CMP of soft metals such as Al, Cu or Ag, have been mediated in part by storage/delivery of a polishing agent slurry at reduced temperatures where flocculation or precipitation of the slurry is minimized. In addition, agitation of the storage tank for the polishing media (to inhibit flocculation), as well as temperature and velocity control of the polishing wheel/surface have been shown to improve CMP homogeneity.

The CMP pad wears at an exponential rate during its initial use and then wears linearly with time. Further, the CMP pad does not remove material uniformly as the pad continues in use. These factors make it difficult to maintain an acceptable removal rate and uniformity in the CMP operation.

Individual spatial dimensions of the top electrode/ferroelectric material/bottom electrode (TE/FE/BE) capacitor in a typical FeRAM are on the order of 100 nm. In order to minimize damage/inhomogeneity during the CMP of this layered structure, the maximum abrasive particle size should be much less than the minimum feature size in the device.

The art continues to seek improvements in the CMP process and in the fabrication of ferroelectric devices such as FeRAMs.

SUMAMARY OF THIE INVETION

The present invention utilizes chemical mechanical polishing to delineate ferroelectric or high permittivity capacitors in geometries that are only limited by the resolution of the lithography and the conformality of thin film deposition processes, meaning that 0.18 $\mu$m or 0.12 $\mu$m structures are possible without dry etching the noble metals or ferroelectric layer. Capacitors of this type have the advantage of having significant contribution of sidewall area, without the need for separate patterning steps for the top and bottom electrode, thus the method of the invention has large economic advantages. Additionally, the approach of the present invention has inherent advantages to protect the plug-barrier-bottom electrode interface from exposure to oxidation.

The present invention for deposition of unpatterned barrier layer, electrodes and ferroelectric film, followed by planarization using CMP, applies to stack capacitor geometry as well as trench capacitor geometry.

In one aspect, the invention relates to a method of fabricating a ferroelectric capacitor structure by sequentially depositing a bottom electrode layer, a ferroelectric layer and a top electrode layer on a base structure, optionally with deposition of a layer of a conductive barrier material beneath the bottom electrode layer, and optionally with deposition of a dielectric buffer layer on the top electrode, to form a capacitor precursor structure, and planarizing the capacitor precursor structure by chemical mechanical polishing to yield the ferroelectric capacitor structure, e.g., a stack capacitor or a trench capacitor. The fabrication process of the invention is carried out without dry etching of the electrode layers or dry etching of the ferroelectric layer, and the resulting ferroelectric capacitor may have a feature size below about 0.35 $\mu$m, with the lower limit for feature size being determined by the step coverage achievable by the constiuent layers and by other physical limits associated with small dimensions in the constituent layers. The optional dielectric buffer layer formed on the top electrode serves as a buffer for the top electrode during the subsequent chemical mechanical polishing processes. The dielectric buffer layer will also serve to relax thickness and depth tolerances on the capacitor layers.

In contrast to prior techniques for forming capacitor structures using ferroelectric materials, the method of the present invention provides a capacitor delineation process that patterns all constituent layers of the capacitor structure—the bottom electrode layer, the ferroelectric or high permittivity layer, the top electrode layer, and the optional conductive barrier layer beneath the bottom electrode surface, and the optional dielectric buffer layer deposited on the top electrode—in a single CMP process, thereby eliminating the need for any patterning of electrodes or ferroelectric layers by conventional RIE or other dry etching, and creating a planarized surface appropriate for subsequent metallization layers. The resulting process of the invention is extremely cost-effective for manufacturing ferroelectric capacitors or other capacitors of similar type.

Further, the process of the invention utilizes an adhesion/barrier layer which serves advantageously as an etch stop, a feature not found in the prior art of which we are aware.

Additionally, the process of the invention contemplates a CMP polishing operation which is suitable for removing both bottom electrode and ferroelectric material layers, either sequentially, with temporal segregation of the respective layer removal steps during polishing, or by use of an appropriate slurry material to effect sequential and then simultaneous removal of the different layer types.

As described more fully hereinafter, the CMP process of the present invention may be carried out in a process flow advantageously including CVD formation of some or all of the capacitor-forming layers.

Prior DRAM practice has not provided a salient guide to the use of CMP in the manner of the present invention. Ferroelectric materials, typically containing Pb or Bi as material components, require different and more complex structures (relative to DRAM IC integration) to keep the ferroelectric material layers of capacitor structures from contacting $SiO_2$ and other materials that are chemically reactive therewith.

The method of the present invention therefore represents a signficant advance in the art.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Although the art has disclosed the delineation of a bottom electrode using a method similar to that of the present invention, the art has not suggested or appreciated the delineation of the entire capacitor structure in a single CMP step as in the method of the present invention. For example, Koyama, et al., "A fully printable, self-aligned and planarized stacked capacitor DRAM cell tehnology for 1 Gbit and beyond," 1995 Symp. on VLSI Technology Digest of Tech. Papers, pp. 17–18, discloses deposition of a ruthenium layer directly over the recess and over the exposed conductive plug without use of a barrier layer or adhesion layer underneath the bottom electrode, in contact with the plug surface and the surface of the capacitor recess. Because the barrier/adhesion layer is absent, Koyama et al.'s specific structure and approach is not useful, particularly in application to ferroelectric capacitors that contain bismuth or lead.

The barrier layer as employed in the method of the present invention, has five primary advantages, as discussed below.

First, in the approach of Koyama, et al., the capacitor recess is required to be taper etched to allow adequate sidewall coverage of the ruthenium film using sputtering. In the method of the present invention, CVD may be used to deposit at least one, and preferably all, of the layers comprising the capacitor—the barrier layer, the electrode layers, and the dielectric (ferroelectric or high E) layers. The use of chemical vapor deposition obviates the necessity for taper etched sidewalls.

Second, while it may be possible for certain material systems (e.g., ruthenium-polysilicon) to maintain adequate electrical continuity through the bottom electrode plug interface, in general a barrier-adhesion layer is required, and by using such a layer a broader range of processing conditions (high temperature and oxidation) may be acccessed during post annealing of the capacitor structure without formation of an insulating oxide between the bottom electrode and the conductive plug, which is typically needed to improve electrical leakage characteristics and in the case of FeRAMs, ferroelectric properties.

In addition to the limited ranges for post-processing that are posed by absence of a barrier layer, the barrier layer also typically improves adhesion between the bottom electrode layer and the surfaces of the bottom electrode recess, which is typically formed of $SiO_2$. Use of an adhesion-promoting barrier layer as in the method of the present invention therefore results in excellent mechanical robustness, as required for chemical mechanical planarization of the structure here considered.

In addition to mechanical robustness, the barrier/adhesion layer also promotes chemical robustness, which is lacking in the prior art due to the absence of such layer. While the structure described in Koyama et al. may work for some dielectrics such as BST, other dielectrics such as PZT ($PbZrTiO_3$) and SBT ($SrBi_2Ta_2O_9$) have highly reactive components (Pb and Bi, respectively) and unacceptable chemical reactions will take place if such layers are brought into contact with $SiO_2$ as in the present invention. The barrier-adhesion layer therefore serves to prevent contact between such chemically interactive materials, and it maintains the chemical integrity of the layers until they are removed in the regions over the isolation oxide by the polishing process.

Fifth, the barrier layer can also serve as a polishing stop layer if the CMP formulation used to remove the electrode layers and the ferroelectric layer is designed to have very low removal rates for the barrier layer. In such manner the uniformity of the polishing process across the entire wafer will be precisely controlled such that overetching in some areas will be prevented. In that case the barrier-adhesion layer that is used as a polishing stop layer is subsequently removed using an appropriate dry etch, or alternatively by a different CMP process.

Concerning other teachings of the art, Fazan et al. U.S. Pat. No. 5,392,189 describes the formation of a bottom electrode using CMP in a geometry similar to that of the above-discussed Koyama et al. reference. Fazan et al. carry out planarization to delineate a bottom electrode. Unlike Koyama et al. who teach that the high E layer and top electrode remain unpatterned, Fazan et al. teach that the high E layer and top electrode layer are patterned using conventional RIE methods.

The present invention provides a much more economical and elegant process flow, which does not require use of poorly developed dry etches for the ferroelectric and noble metal electrodes, which is all that is currently available for metals such as Pt, Ir, Pd, etc. Another shortcoming of the prior art approach of using conventional methods to pattern the top electrode and the high E (or ferroelectric) layer is that subsequent planarization will be necessary for robust metallization, particularly in the case of higher numbers of metallization layers. Fazan et al. also describe a planar capacitor bottom electrode that is formed using CMP, with the shortcomings already discussed. In addition to the use of conventional patterning of the top electrodes and high E layers, Fazan et al. limit their disclosed structure to the use of non-oxidizable metals such as Pt. The present invention does not have such limitation, and conductive oxides such as $IrO_2$ and $RhO_2$, either singly or alloyed with noble metals, or in a multilayer "hybrid" configuration with noble metals. Fazan et al. also does not employ a continuous barrier layer formed all along the inside and adjacent surfaces of the capacitor recess, and for such reason suffers disadvantages already described herein. The present invention by its use of a barrier layer provides robust chemical and mechanical integrity, and a polishing stop layer which can subsequently be removed.

U.S. Pat. No. 5,318,927 to Sandhu, et al. describes a broad variety of polishing slurry formulations useful for CMP of insulating inorganic oxide materials such as BST, PZT, etc., and such formulations may advantageously be employed in the practice of the invention. Other slurry formulations which may be advantageously used in the practice of the present invention include the high purity fine metal oxide aqueous slurry compositions described in Matthew Neville, et al. U.S. Pat. No. 5,527,423 issued Jun. 18, 1996. The disclosures of the Sandhu et al. and the Neville et al. patents are hereby incorporated herein by reference in their entirety.

Referring now to the drawings, FIGS. 1A through 1H schematically show a process flow for the invention as it applies to a stack capacitor. The steps shown in the drawings for FIGS. 1A through 1H, are described below with reference to the following correspondingly identified sequence of process steps A through H, respectively.

Figure 1A:
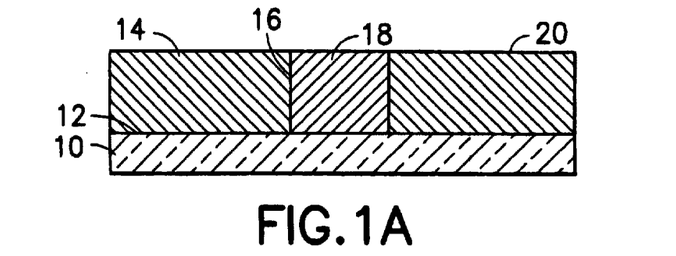
FIGS. 1A through 1H show a schematic process flow for patterning sub-micron ferroelectric capacitors in a stack capacitor configuration using CMP in accordance with the present invention, with CVD of the ferroelectric, electrode and barrier layers being desirable for feature sizes below 0.3 $\mu$m.
Figure 1B:
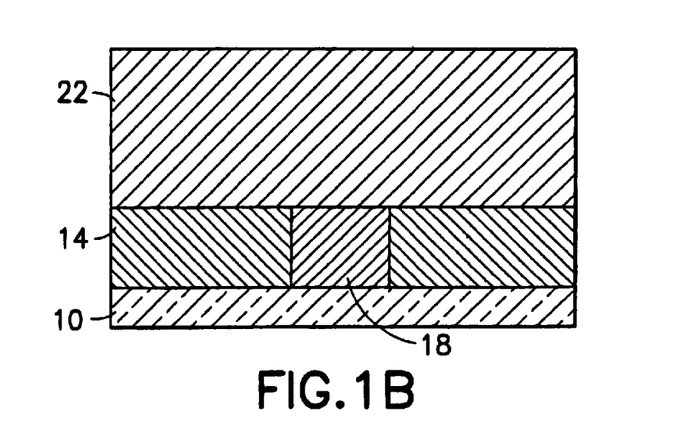

As shown in FIG. 1A (step A), a substrate 10 (typically formed of silicon, although other substrate materials of construction, such as GaAs, are possible) is provided with transistors and other circuitry (not shown) already fabricated below the wafer surface 12, according to conventional fabrication techniques. The silicon circuitry is covered with a dielectric insulating layer (isolation dielectric) 14 such as $SiO_2$, $Si_3N_4$ B-doped $SiO_2$, P-doped $SiO_2$, B and P-doped $SiO_2$, low dielectric constant organic insulators, $SiO_xF_y$, B-doped $SiO_xF_y$, P-doped $SiO_xF_y$, and B and P-doped $SiO_xF_y$. wherein x+y=2, etc. Vias 16 to the Si circuitry are opened using photolithography and dry-etching, a plug 18 of suitable material, such as doped silicon, doped for example with boron, phosphorus or arsenic, e.g., to form n-Si or p-Si, or tungsten, is formed in the vias using CVD, and the surface 20 is planarized using dry etching or CMP.

In step B (FIG. 1B), a capacitor recess dielectric 22, of a material such as $SiO_2$, $Si_3N_4$ B-doped $SiO_2$, P-doped $SiO_2$, B and P-doped $SiO_2$, low dielectric constant organic insulators, $SiO_xF_y$, B-doped $SiO_xF_y$, P-doped $SiO_xF_y$, and B and P-doped $SiO_xF_y$, wherein x+y=2, etc., is formed over the surface of the plugs 18 and isolation dielectric 14 using CVD, sputtering or wet deposition methods.

In step C (FIG. 1C), capacitor recesses 24 are formed in the surface of the insulating layer 22 using photolithography and dry-etching. The top surface of the conductive plug 26 may then be sputter etched or heat treated to ensure a clean surface prior to conductive barrier deposition in step D.

Figure 1C:
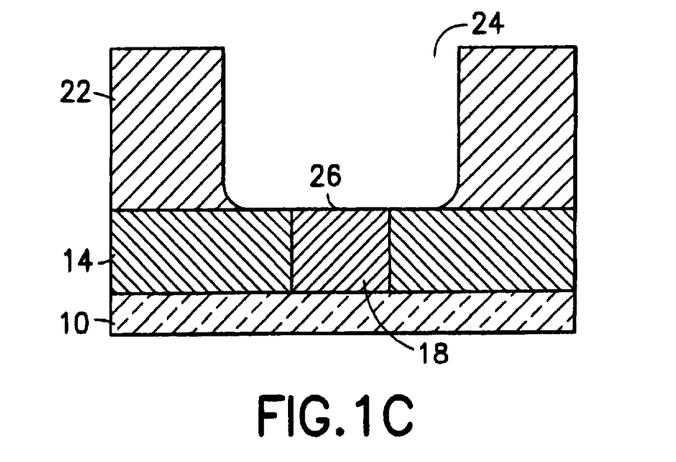

The shape of the capacitor recess 24 will generally be engineered to minimize sharp angles at corners of the three dimensional capacitor structure, in order to prevent cracking of the layers (which could cause short circuits) or irregular microstructure, thickness non-uniformities, etc. An optimum shape may therefore be circular or alternatively polygonal with rounded corners, and the edge at the recess bottom 25 will be rounded using techniques known to those skilled in reactive ion etching (RIE) of materials.

In addition to minimizing sharp angles in the recess inner surface, sloped sidewalls may be used to improve the sidewall coverage of the capacitor layers 28, 30, 32, and 34, especially if they are deposited by non-CVD techniques such as sputtering or vacuum evaporation.

Figure 1D:
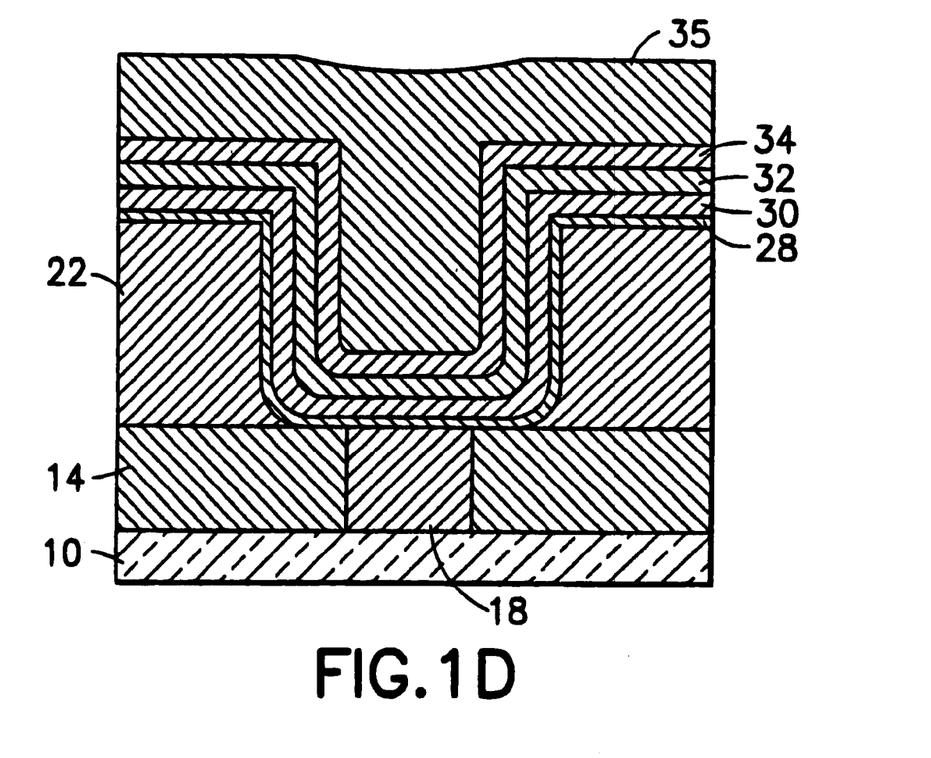

The conducting and insulating layers that will comprise the capacitor layers are deposited in step D (FIG. 1D). The layers include (in the sequence they would be deposited in): an optional conductive barrier layer 28, the bottom electrode 30 (BE), the ferroelectric layer 32 (FE) and the top electrode 34 (TE). The conductive barrier layer may be TaWN, TaN, TiWN, TaSiN, TaAlN, NbN, ZrN, TaTiN, TiN, TiSiN, TiAlN, $IrO_2$, SiC or any other material suitable to withstand oxidation and prevent diffusion of Si. The conductive barrier layer 28 may be employed to provide a polishing stop layer which is subsequently removed by CMP or dry etching methods. The BE and TE layers are typically noble metals such as Pt or Ir, or alloys of similar materials, but such layers may be generally formed of any suitable materials such as noble metals, noble metal/non-noble metal alloys, noble metal/noble metal oxide mixtures, noble metal multilayers, and noble metal/non-noble metal multilayers. In some instances, TE need not be a noble metal, since it does not need to withstand the highly oxidizing deposition environment.

The FE layer material is typically PZT or SBT, but it may be bismuth titanate or some other ferroelectric thin film composition. (Alternatively it may be a similar multicomponent oxide such as BST for high capacitance, or $LaCaMnO_3$ for magnetoresistance, etc.) Other FE materials such as derivatives of the foregoing FE species formed by covalent or non-covalent substitutions in the aforementioned materials, may also be employed.

Figure 1E:
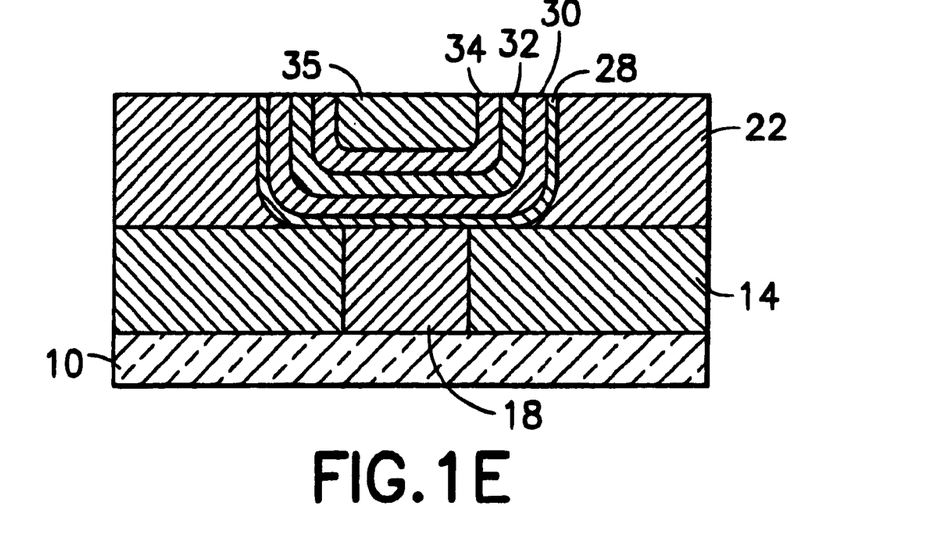
Figure 1F:
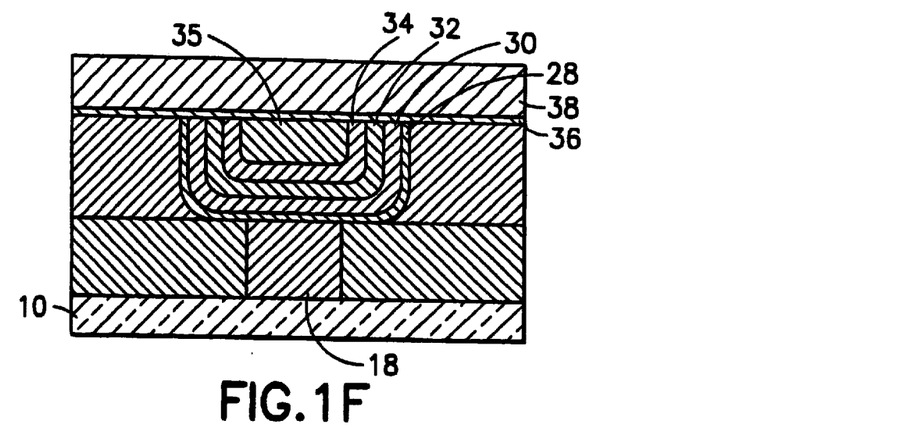
Figure 1G:
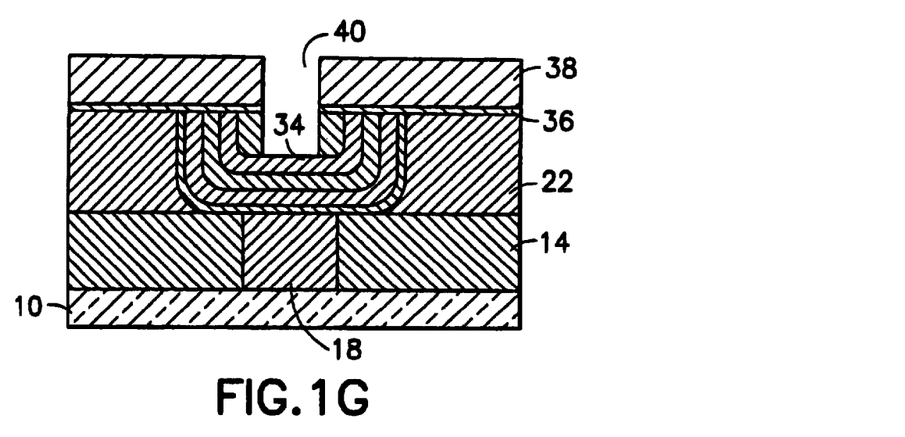
Figure 1H:
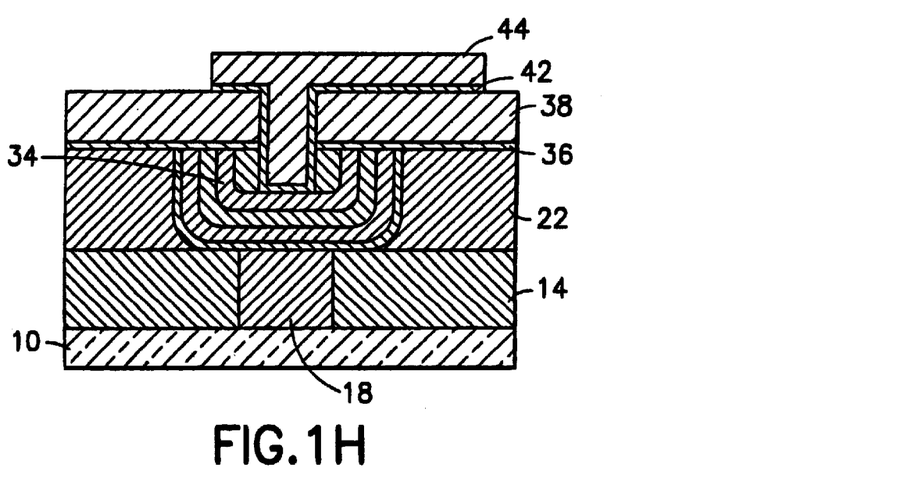

It is evident that some sidewall coverage of these layers is necessary and the different layers require sidewall coverage for different reasons. The barrier must cover the sidewall in order to make good adhesion between the BE and the capacitor recess dielectric, because excellent mechanical robustness is needed for the polishing in step E. The BE must cover the sidewall to achieve adequate thickness for electrical continuity if the sidewall part of the structure is to be used for the chosen application. The dielectric must have adequate sidewall coverage to obtain uniform electrical properties in the capacitor, and to prevent short circuiting between the TE and BE. For geometries>0.5 $\mu$m, the conductive layers can be deposited using sputtering, which results in adequate sidewall coverage. For smaller geometries or high aspect ratios in the capacitor recess, CVD of the conductive layers may be needed. Alternatively, other highly conformal deposition methods such as ionized PVD, collimated sputtering, low pressure PVD or electroplating may be used instead of CVD. Generally, CVD of the FE layer will be needed to prevent shorting between the TE and BE, although there may be cases where the FE can be sputtered with satisfactory results.

Following deposition of the top electrode 34, a dielectric buffer layer 35 may be deposited to serve as a buffer for the top electrode during the subsequent CMP processes, as shown in step E. The dielectric buffer layer will also serve to relax thickness and depth tolerances on the capacitor layers 28, 30, 32, and 34 and the capacitor recess, respectively.

For example, the capacitor recess may have depth of 0.5 $\mu$m, and the capacitor layers may have total thickness of 0.35 $\mu$m (e.g. barrier layer: 0.05 $\mu$m, top and bottom electrodes 0.1 $\mu$m each, and the ferroelectric layer 0.1 $\mu$m.) The dielectric buffer layer will then be deposited with thickness>0.15 $\mu$m.

In such manner the CNP process may be terminated before the top electrode is exposed to the polishing process (except at its edges), and damage that could result from the polishing directly on the majority of the top electrode surface will be avoided. The majority of the capacitor layer structure 28, 30, 32, and 34, will also be shielded from any post-CMP cleaning operations that are employed. For the layer thicknesses illustratively given above, the absence of the dielectric buffer layer would result in an undesirable recess above deposition of the capacitor layers, and that recess would result in unsatisfactory collection of polishing media during the CMP process. The dielectric buffer layer may be composed of $SiO_2$, B-doped $SiO_2$, P-doped $SiO_2$, B and P-doped $SiO_2$, low dielectric constant organic insulators, $SiO_xF_y$, B-doped $SiO_xF_y$, P-doped $SiO_xF_y$, and B and P-doped $SiO_xF_y$, wherein x+y=2, etc. or any other suitable insulating materials that may be easily removed using CMP, such as $Si_3N_4$, $TiO_2$, etc.

Another important aspect of the recess geometry is its aspect ratio (depth/width). Larger aspect ratios (e.g., >1/3) may be used in order to utilize the sidewall contribution of the three dimensional capacitor, in cases where the electrical polarization (signal) due to the bottom of the capacitor is not large enough to be recognized reliably by the readout circuit. In general, that will be the case for high levels of memory density, such as>16 Mb. Smaller values of aspect ratio (<1/3) will be used when sufficient capacitor area (and electrical polarization) is achieved with only the bottom layer of the three dimensional capacitor.

In step E (FIG. 1E), the film stack is planarized using CMP which forms the three dimensional capacitors in the capacitor recesses. The CMP process is comprised of mechanical polishing with a slurry that typically contains an abrasive, typically a metal oxide, metal carbide, or metal nitride, that is harder than the materials being removed, such as silica, alumina, ceria, etc., with chemical additives present to promote selective removal of the barrier, TE, FE and BE. It may be required to sequentially apply two or more separate CMP processes (or slurries) for removal of the different materials in the capacitor, i.e., Pt may require a different CMP process than SBT, for example. A post-CMP anneal in an oxidizing environment may be carried out if required to remove physical or chemical damage to the ferroelectric film that was subjected to mechanical and chemical agitation during its partial removal by CMP. The CMP process may at least partially remove the buffer layer 35, and such layer is omitted in the subsequent process flow for ease of illustration and description.

Step F (FIG. 1F) involves sequentially depositing an insulating passivation layer 36 and an inter-level dielectric (ILD) 38 over the capacitors that were formed in the previous step. This insulating passivation layer is deposited using CVD, sputtering or wet deposition methods, and its purpose is to prevent undesirable chemical reactions and interdiffusion between the top edge of the ferroelectric film or electrodes and the overlying ILD layer that typically contains Si or $SiO_2$. PZT and SBT in particular contain the highly chemically reactive and mobile species of Pb and Bi respectively, and it is important to prevent interdiffusion of those or similar species with the ELD layer. The passivation layer may for example be $TiO_2$, $HfO_2$, $Nb_2O_5$, $ZrO_2$, $Ta_2O_5$, $Si_3N_4$ and mixtures thereof, or other similar dielectric materials that include mixtures of those materials too. The ILD is formed of a material such as $SiO_2$, $Si_3N_4$ B-doped $SiO_2$, P-doped $SiO_2$, B and P-doped $SiO_2$, low dielectric constant organic insulators, $SiO_xF_y$, B-doped $SiO_xF_y$, P-doped $SiO_xF_y$, and B and P-doped $SiO_xF_y$, wherein x+y=2, etc., and is deposited using CVD, sputtering or wet deposition methods.

In step G (FIG. 1G) vias 40 are opened in the barrier layer and ILD using photolithography and dry-etching.

Finally, in step H (FIG. 1H), a diffusion barrier 42 of a material such as Ta, TaN, TiN, WN or other suitable material is deposited using CVD or sputtering, and metallization 44 is deposited over that barrier, in order to conformally fill the via. The metallization may be either CVD-applied W or Al that is sputtered at high temperatures or reflowed, or Cu, or Al—Cu alloys, or other conductive materials. The metallization is then patterned using photolithography and dry-etching. Alternatively, such metallization may be patterned using damascene or dual damascene processes, which are well known to those skilled in the art.

In the FIGS. 1A–1H process flow for patterning sub-micron ferroelectric capacitors in a stack capacitor configuration, using CMP, chemical vapor deposition (CVD) of the ferroelectric, electrode and barrier layers is desirably employed for feature sizes below 0.35 μm.

FIGS. 2A through 2H show a process flow for the method of the invention as it applies to a trench capacitor. The steps shown in FIGS. 2A through 2H are described below with reference to the correspondingly identified sequence of steps A through H.

In step A (FIG. 2A), a substrate 100 formed of a material such as silicon, although other materials such as GaAs are potentially usefully employed, is provided, with transistors and other circuitry (not shown) fabricated in the wafer surface. Alternatively, the substrate may be p-type, with no transistors fabricated in it at the time of capacitor formation.

In step B (FIG. 2B), capacitor recesses 102 are formed in the surface of the Si using photolithography and dry-etching.

Figure 2A:
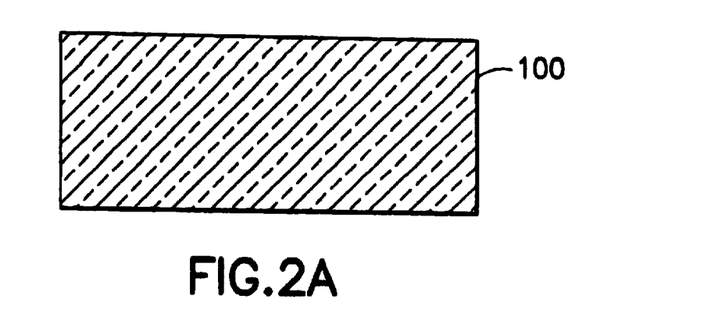
FIGS. 2A through 2H show a schematic process flow for forming sub-micron ferroelectric capacitors in a trench capacitor configuration using CMP in accordance with the invention, with CVD of the ferroelectric, electrode and barrier layers being desirable for feature sizes below 0.35 $\mu$m or for high aspect ratios.
Figure 2B:
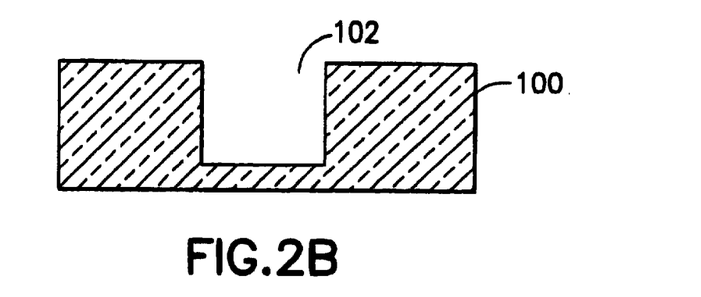
Figure 2C:
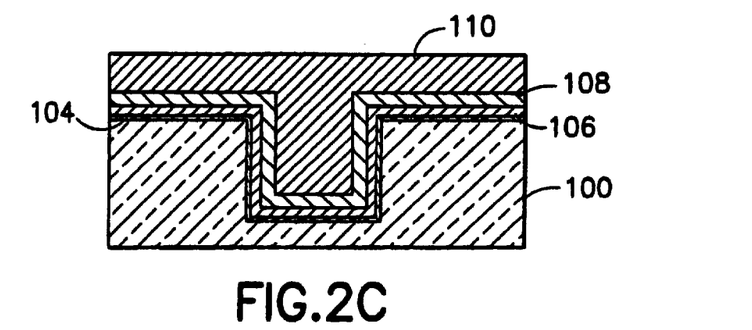
Figure 2D:
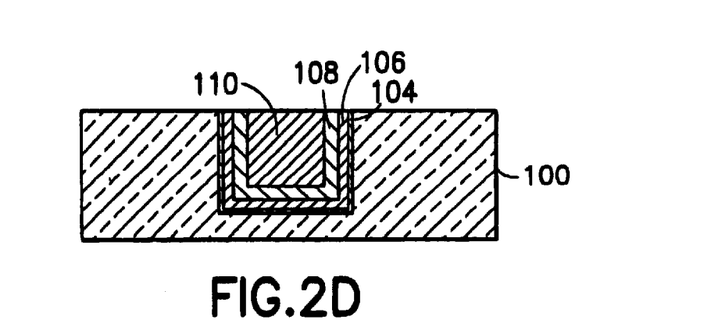

Next (step B; FIG. 2B), the conducting and insulating layers that will comprise the capacitor layers are deposited. The layers include (in the sequence they are deposited in): a conductive barrier layer 104, the bottom electrode (BE) 106, the ferroelectric layer (FE) 108, and the top electrode (TE) layer 110. The barrier may be TiN, TiSiN, TiAlN, $IrO_2$, SiC or some other material suitable to withstand oxidation and prevent diffusion of Si. The BE and TE layers are typically noble metals such as Pt or Ir, or alloys of similar materials, but such layers may be generally formed of any suitable materials such as noble metals, noble metal/non-noble metal alloys, noble metal/noble metal oxide mixtures, noble metal multilayers, and noble metal/non-noble metal multilayers. The TE layer need not be formed of a noble metal, since such layer does not need to withstand the highly oxidizing deposition environment. The FE layer is typically formed of PZT or SBT, but it may be alternatively formed of bismuth titanate or some other ferroelectric thin film material, or alternatively it may be a similar multicomponent oxide such as BST for high capacitance, or $LaCaMnO_3$ for magnetoresistance, etc. Other FE materials such as derivatives of the foregoing FE species formed by covalent or non-covalent substitutions in the aforementioned materials, may also be advantageously employed. Sidewall coverage issues are similar to those described above, and the high aspect ratio (depth/width) of trenches in the Si substrate make CVD highly preferred for fabricating all the capacitor-forming layers.

In step D (FIG. 2D), the film stack is planarized using CMP which forms the three dimensional capacitor in the capacitor recesses. The CMP process is comprised of mechanical polishing with a slurry that containing an abrasive, typically a metal oxide, metal carbide, or metal nitride, such as silica, alumina, ceria, etc., that is harder than the materials being removed, with chemical additives present to promote selective removal of the barrier, TE, FE and BE. It may be required to sequentially apply more than one CMP process, and to post anneal the capacitor structure in an oxidizing environment, as described above.

Figure 2E:
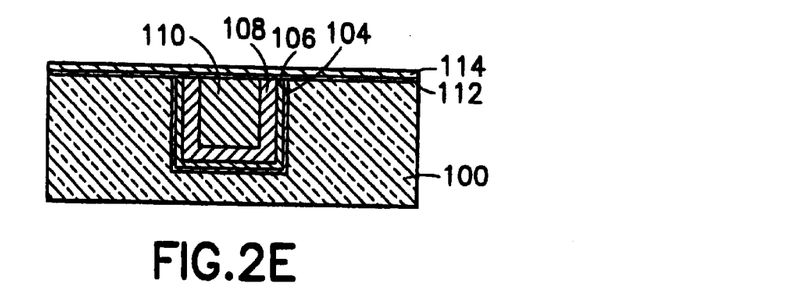

Next (step 2E; FIG. 2E), an insulating passivation layer 112 and an inter-level dielectric (ILD) layer 114 are sequentially deposited over the capacitors that were formed in the previous step, as described above.

Figure 2F:
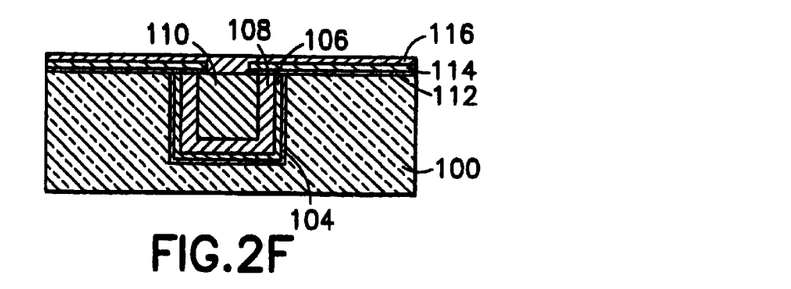
Figure 2G:
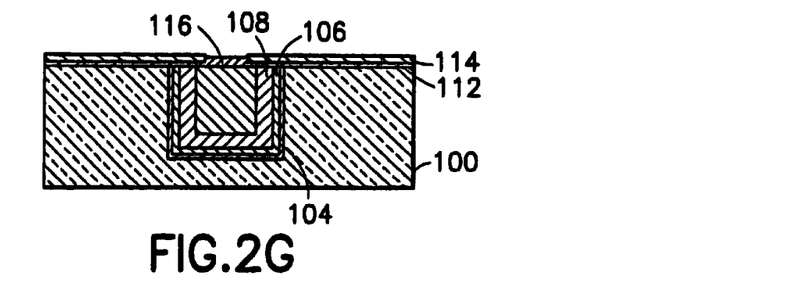

Vias then are opened (step 2F; FIG. 2F) in the barrier comprising the insulating passivation layer and ILD layer using photolithography and dry-etching. A diffusion barrier layer 116 of a material such as Ta, TaN, TiN, WN or another suitable material is deposited using CVD or sputtering.

In step G (FIG. 2G), the barrier layer deposited previously is patterned using CMP or dry etching, or alterativelly a damascene or dual damascene process may be employed for such patterning.

Figure 2H:
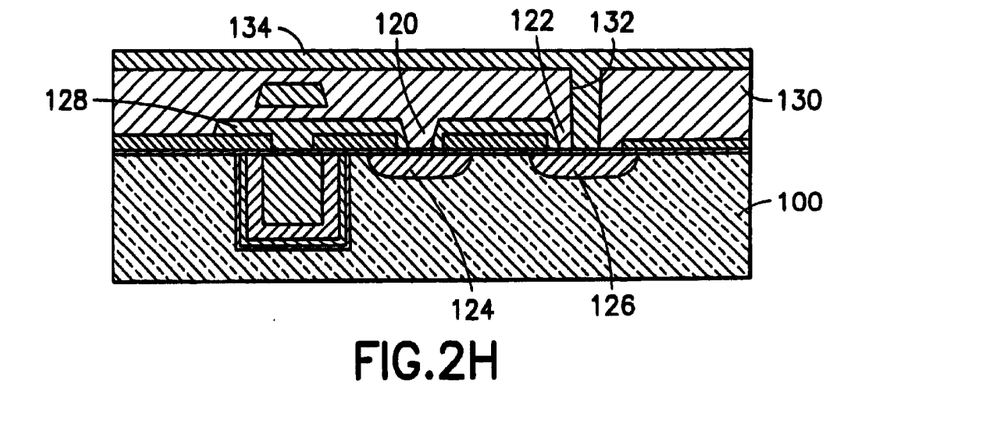

Vias 120 and 122 are opened to doped regions 124 and 126, respectively, formed previously (step H; FIG. 2H), and p-Si or some other suitable conductor 128 is deposited and patterned to form part of the circuitry for the memory cell. Dielectric isolation material 130 is then formed over the patterned p-Si word lines and plate, vias 132 are opened to the transfer transistor (doped Si regions) and the bit line 134 is formed by deposition and patterning of Al or some other suitable conductor, with suitable barrier layers at the Si interface.

In the above-described method for forming sub-micron ferroelectric capacitors in a trench capacitor configuration using CMP, it is preferred to utilize CVD to form the ferroelectric, electrode and barrier layers, when feature sizes below 0.35 $\mu$m or high aspect ratios are desired.

While the invention has been described herein with reference to specific aspects, features and embodiments, it will be recognized that the utility of the invention is not thus limited, but rather extends to and encompasses other modifications, variations and other embodiments. Accordingly, the invention is to be correspondingly broadly construed, in respect of the claims hereinafter set forth.

What is claimed is:

1. A method of fabricating a ferroelectric capacitor structure by sequentially depositing a bottom electrode layer, a ferroelectric layer and a top electrode layer on a base structure, to form a capacitor precursor structure, and planarizing the capacitor precursor structure by chemical mechanical polishing to yield said ferroelectric capacitor structure.

2. A method according to claim 1, wherein the capacitor structure is selected from the group consisting of stack capacitors and trench capacitors.

3. A method according to claim 1, further comprising depositing a dielectric buffer layer over the capacitor precursor structure prior to planarizing same by chemical mechanical polishing.

4. A process according to claim 1, carried out without dry etchlinig of the electrode layers or dry etching of the ferroelectric layer, and wherein the ferroelectric capacitor structure has a feature size below 1 $\mu$m.

5. A process according to claim 1, wherein the ferroelectric capacitor structure has a feature size below 0.35 $\mu$m.

6. A process for fabricating a stack capacitor on a substrate including buried circuitry overlaid by an isolation dielectric material, comprising:

forming a first via in the isolation dielectric material to the buried circuitry in the substrate;

depositing a plug in the first via;

planarizitig the isolation dielectric material and plug;

depositing the isolation dielectric material over the planarized plug;

forming a capacitor recess in a surface of the isolation dielectric material;

depositing over the isolation dielectric material in sequence, a bottom electrode layer, a ferroelectric layer and a top electrode layer, optionally with deposition of a layer of a conductive barrier material between the isolation dielectric material and the bottom electrode layer, and optionally with deposition of a dielectric buffer layer over the top electrode layer, to form a film stack of the sequentially deposited layers;

planarizing the film stack by chemical mechanical polishing to yield three-dimensional stack capacitor in the capacitor recess;

sequentially depositing an inIsulating passivation layer and an inter-level dielectric layer to form a barrier structure over the three-dimenisionial stack capacitor in the capacitor recess;

forming a second via in the barrier structure;

depositing over the barrier structure and second via in sequence a diffusion barrier layer and a metallization layer, to conformally fill the second via in the barrier structure; and pattteriling the metallization layer to form a line structure for the three-dimensional stack capacitor.

7. A process according to claim 6, wherein the substrate is formed of a material selected from the group consisting of silicon and gallium arsenide.

8. A process according to claim 6, wherein the substrate is formed of silicon.

9. A process according to claim 6, wherein the isolation dielectric material comprises a material selected from the g,roup consisting of $SiO_2$, $Si_3N_4$, B-doped $SiO_2$, P-doped $SiO_2$, B and P-doped $SiO_2$, low dielectric constant organic insulator materials, $SiO_xF_y$, B-doped $SiO_xF_y$, P-doped $SiO_xF_y$, and B and P-doped $SiO_xF_y$, wherein x+y=2.

10. A process according to claim 6, wherein the first via is are fabricated in the isolation dielectric material by photolitliography and diy etch removal of isolation dielectric material from a via area of the material.

11. A process according to claim 6, wherein the plug is formed of a material selected from the group consisting of Si doped with a dopant selected from the group consisting of B, P, As and combinations thereof, and W.

12. A process according to claim 6, wherein the substrate and plug are planarized using a planarization method selected from the group consisting of dry etching and chemical mechanical polishing.

13. A process according to claim 6, wherein the isolation dielectric material comprises a material selected from the group consisting of $SiO_2$, $Si_3N_4$, B-doped $SiO_2$, P-doped $SiO_2$, B and P-doped $SiO_2$, low dielectric constant organic insulators, $SiO_xF_y$, B-doped $SiO_xF_y$, P-doped $SiO_xF_y$, and B and P-doped $SiO_xF_y$, wherein x+y=2.

14. A process according to claim 6, wherein the isolation dielectric material is deposited over the plug by a method selected from the group consisting of CVD, sputtering and wet deposition methods.

15. A process according to claim 6, wherein the capacitor recess is formed by photolithography and dry-etching.

16. A process according to claim 6, with a conductive barrier layer between the isolation dielectric material and the bottom electrode layer, wherein a top surface of the conductive plug is cleaned by a method selected from the group consisting of sputter etching and heat treating, prior to the deposition of the conductive barrier layer.

17. A process according to claim 6, wherein the conductive barrier layer is formed of a material selected from the ,roup consisting of TaWN, TaN, TiWN, TaSiN, TaAlN, NbN, ZrN, TaTiN, TiN, TiSiN, TiAlN, $IrO_2$, and SiC.

18. A process according to claim 6, wherein the bottom electrode is formed of a material selected from the group consisting of noble metals, noble metal/non-noble metal alloys, noble metal/noble metal oxide mixtures, noble metal multilayers, and noble metal/non-noble metal multilayers.

19. A process according to claim 6, wherein the top electrode is formed of a noble metal, noble metal/non-noble metal alloys, noble metal/noble metal oxide mixtures, noble metal multilayers, and noble metal/non-noble metal multilayers.

20. A process according to claim 6, wherein the ferroelectric material layer is formed of a material selected from the group consisting of PZT, SBT, bismuth titanate, BST, $LaCaMnO_3$, and materials formed by covalent or non-covalent substitutions in the foregoing materials.

21. A process according to claim 6, wherein each of the top electrode layer, ferroelectric layer and bottom electrode layer deposition steps is independently carried out by a method selected from the group consisting of sputtering and chemical vapor deposition.

22. A process according to claim 6, wherein each of the top electrode layer, ferroelectric layer and bottom electrode laver deposition steps is carried out by chemical vapor deposition.

23. A process according to claim 6, wherein the film stack chemical mechanical polishing comprises mechanical polishing with a slurry including (i) an abrasive material selected from the group consisting of metal oxides, metal nitrides and metal carbides, and (ii) chemical additives for removal of the conductive barrier layer, bottom electrode layer, ferroelectric layer and top electrode layer.

24. A process according to claim 23, wherein the slurry comprises an abrasive material selected from the group consisting of silica, alumina and ceria.

25. A process according to claim 23, wherein the slurry comprises an abrasive material selected from the group consisting of metal nitrides and metal carbides.

26. A process according to claim 6, wherein the film stack chemical mechanical polishing comprises multiple chemical mechanical polishing steps, each carried out with a different slurry material.

27. A process according to claim 6, with a conductive barrier layer between the isolation dielectric material and the bottom electrode layer, wherein the conductive barrier layer comprises a polishing stop layer, and wherein the polishing stop layer is subsequently removed by a removal technique selected from the group consisting of chemical mechanical polishing and dry etching.

28. A process acccording to claim 6, further comprising after planarizing the film stack a step of removing conductive residue at edges of the three-dimensional stack capacitor by a wet or dry etch.

29. A process according to claim 6, further comprising after the film stack chemical mechanical polishing, conducting a post-chemical mechanical polishing annealing to remove physical and/or chemical damage to the ferroelectric layer during the chemical mechanical polishing.

30. A process according to claim 6, wherein the barrier structure comprising the insulating passivation layer and inter-level dielectric layer, is deposited by a method selected from the group consisting of CVD, sputtering and wet deposition methods.

31. A process according to claim 6, wherein the insulating passivation layer is formed of a material selected from the group consisting of $TiO_2$, $HfO_2$, $Nb_2O_5$, $ZrO_2$, $Ta_2O_5$, $Si_3N_4$ and mixtures.

32. A process according to claim 6, wherein the inter-level dielectric layer is formed of a material selected from the group consisting of $SiO_2$, $Si_3N_4$, B-doped $SiO_2$, P-doped $SiO_2$, B and P-doped $SiO_2$, low dielectric constant organic insulators, $SiO_xF_y$, B-doped $SiO_xF_y$, P-doped $SiO_xF_y$, and B and P-doped $SiO_xF_y$, wherein x+y=2.

33. A process according to claim 6, wherein the second via is formed in the barrier structure by photolithography and dry etching.

34. A process according to claim 6, wherein a dielectric buffer layer is deposited over the top electrode layer prior to planarizing the film stack by chemical mechanical polishing.

35. A process according to clain 6, wherein the metallization layer is formed of a material selected fiom the group consisting of W, Al, Cu, and Al—Cu alloys.

36. A process according to claim 6, wherein the metallization layer is patterned by photolithography and dry-etching.

37. A process according to claim 6, wherein the metallization layer is patterned by a damascene or a dual damascene process.

38. A process according to claim 6, wherein the three-dimensional stack capacitor has a feature size below 0.35 µm.

39. A process for fabricating a trench capacitor on a substrate including a device region, comprising:

forming a capacitor recess in the substrate;

depositing over the capacitor recess in sequence, a bottom electrode layer, a ferroelectric layer and a top electrode layer, optionally with deposition of a layer of a conductive barrier material between the capacitor recess and the bottom electrode layer, and optionally with deposition of a dielectric buffer layer over the top electrode layer, to forn a film of the sequentially deposited layers;

planarizing the film of the sequentially deposited layers by chemical mechanical polishing to yield a trench capacitor in the capacitor recess;

sequentially depositing an inisulating passivation layer and an inter-level dielectric layer to form a barrier structure over the trncli capacitor in the capacitor recess;

forming a via in the barrier structure;

depositing over the barrier structure and via a diffusion barrier layer;

patterning the diffusion barrier layer in a selected pattern;

forming a first via to a device region of the substrate;

forming circuitry structure over the substrate including a plate and a first line element of a word and bit line structure for the trench capacitor;

depositing an isolation dielectric material over the plate and line elements;

forming a second via to the device region of the substrate;

depositing a metallization layer, to conforinally fill the second via in the isolation dielectric material; and patterinig the metallization layer to form a complimenitary line element of the word and bit line structure for the trench capacitor.

40. A process according to claim 39, wherein the substrate is formed of a material selected from the group consisting of silicon and gallium arsenide.

41. A process according to claim 39, wherein the substrate is formed of silicon.

42. A process according to claim 39, wherein the isolation dielectric material comprises a material selected from the group consisting of $SiO_2$, $Si_3N_4$, B-doped $SiO_2$, P-doped $SiO_2$, B and P-doped $SiO_2$, low dielectric constant organic insulator materials, $SiO_xF_y$, B-doped $SiO_xF_y$, P-doped $SiO_xF_y$, and B and P-doped $SiO_xF_y$, wherein x+y=2.

43. A process according to claim 39, wherein the second via is fabricated in the isolation dielectric insulating material by photolithography and dry etch removal of isolation dielectric insulating material from a via area of the material.

44. A process according to claim 39, wherein the capacitor recess is formed by photolithography and dry-etching.

45. A process according to claim 38, wherein the conductive barrier layer is formed of a material selected from the group consisting of TaWN, TaN, TiWN, TaSiN, TaAlN, NbN, ZrN, TaTiN, TiN, TiSiN, TiAlN, $IrO_2$, and SiC.

46. A process according to claim 39, wherein the bottom electrode layer is formed of a material selected from the group consisting of noble metals, noble metal/non-noble metal alloys, noble metal/noble metal oxide mixtures, noble metal multilayers, and noble metal/non-noble metal multilayers.

47. A process according to claim 39, wherein the top electrode layer is formed of a material selected from the group consisting of noble metals, noble metal/non-noble metal alloys, noble metal/noble metal oxide mixtures, noble metal multilayers, and noble metal/non-noble metal multilayers.

48. A process according to claim 39, wherein the ferroelectric material layer is formed of a material selected from the group consisting of PZT, SBT, bismuth titanate, BST, $LaCaMnO_3$, and materials formed by covalent or non-covalent substitutions in the foregoing materials.

49. A process according to claim 39, wherein each of the top electrode layer, ferroelectric layer and bottom electrode layer deposition steps is independently carried out by a method selected from the group consisting of sputtering and chemical vapor deposition.

50. A process according to claim 39, wherein each of the top electrode layer, ferroelectric layer and bottom electrode layer deposition steps is carried out by chemical vapor deposition.

51. A process according to claim 39, wherein the film chemical mechanical polishing comprises mechanical polishing with a slurry including (i) an abrasive material selected from the group consisting of metal oxides, metal nitrides and metal carbides, and (ii) chemical additives for removal of the conductive barrier layer, bottom electrode layer, ferroelectric layer and top electrode layer.

52. A process according to claim 51, wherein the slurry comprises an oxide abrasive material selected from the group consisting of silica, alumina and ceria.

53. A process according to claim 39, wherein the film chemical mechanical polishing comprises multiple chemical mechanical polishing steps, each carried out with a different slurry material.

54. A process according to claim 39, with a conductive barrier layer beneath the bottom electrode layer, wherein the conductive barrier layer comprises a polishing stop layer, and wherein the polishing stop layer is subsequently removed by a removal technique selected from the group consisting of chemical mechanical polishing and dry etching.

55. A process according to claim 39, further comprising after planarizing the film a step of removing conductive residue at edges of the trench capacitor by a wet or dry etch.

56. A process according to claim 39, wherein the barrier structure comprising the insulating passivation layer and inter-level dielectric layer, is deposited by a method selected from the group consisting of CVD, sputtering and wet deposition methods.

57. A process according to claim 39, wherein the insulating passivation layer is formed of a material selected from the group consisting of $TiO_2$, $HfO_2$, $Nb_2O_5$, $ZrO_2$, $Ta_2O_5$, $Si_3N_4$ and mixtures thereof.

58. A process according to claim 39, wherein the inter-level dielectric layer is formed of a material selected from the group consisting of $SiO_2$, $Si_3N_4$, B-doped $SiO_2$, P-doped $SiO_2$, B and P-doped $SiO_2$, low dielectric constant organic insulators, $SiO_xF_y$, B-doped $SiO_xF_y$, P-doped $SiO_xF_y$, and B and P-doped $SiO_xF_y$, wherein x+y=2.

59. A process according to claim 39, wherein the via is formed in the barrier structure by photolithography and dry-etching.

60. A process according to claim 39, wherein a dielectric buffer layer is deposited over the top electrode layer prior to planarizing the film stack by chemical mechanical polishing.

61. A process according to claim 39, wherein the metallization layer is formed of a material selected from the group consisting of W, Al, Cu, and Al—Cu alloys.

62. A process according to claim 39, wherein the metallization is patterned by photolithography and dry-etching.

63. A process according to claim 39, wherein the metallization is patterned by a damascene or a dual damascene process.

64. A process according to claim 39, wherein the substrate comprises buried circuitry.

65. A process according to claim 39, wherein the substrate comprises p-type silicon material.

66. A process according to claim 39, wherein the circuitry structure is formed at least in part by deposition of polysilicon.

67. A process according to claim 39, wherein the trench capacitor has a feature size below 0.35µm.

68. A process according to claim 6, further comprising depositing a dielectric buffer layer over the film stack prior to planarizing same by chemical mechanical polishing.

69. A process according to claim 39, further comprising depositing a dielectric buffer layer over the film of the sequentially deposited layers prior to planarizing same by chemical mechanical polishing.

* * * * *

UNITED STATES PATENT AND TRADEMARK OFFICE
CERTIFICATE OF CORRECTION

PATENT NO. : 5,976,928
DATED : Nov. 2, 1999
INVENTOR(S) : Peter S. Kirlin; Peter C. Van Buskirk It is certified that error appears in the above-identified patent and that said Letters Patent is hereby corrected as shown below:

Title page, Item[75] Inventors:
Peter C. Van Buskirk should be listed as the first inventor and Peter S. Kirlin should be listed as the second inventor.

Signed and Sealed this

Nineteenth Day of September, 2000

Attest:

Q. TODD DICKINSON

Attesting Officer

Director of Patents and Trademarks

UNITED STATES PATENT AND TRADEMARK OFFICE
CERTIFICATE OF CORRECTION

PATENT NO.   : 5,976,928
DATED        : November 2, 1999
INVENTOR(S)  : Peter S. Kirlin and Peter C. Van Buskirk It is certified that error appears in the above-identified patent and that said Letters Patent is hereby corrected as shown below:

Title page,
[54]: change "FERAM" to -- FeRAM --.

Column 1,
Line 2: change "FERAM" to -- FeRAM --.
Line 6: change "inventi on" to -- invention --.
Line 8: change "acc ess" to -- access --.
Line 14: change "(hST)" to -- (BST) --.
Line 46: change "baprier" to -- barrier --.
Line 47: change "onfiguration" to -- configuration --.
Line 57: change "ord er" to -- order --.

Column 7,
Line 25: change "0.3" to -- 0.35 --.
Line 62: change "E" to -- $\in$ --.

Column 8,
Line 49: change "E" to -- $\in$ --.
Line 51: change "E" to -- $\in$ --.
Line 59: change "E" to -- $\in$ --.
Line 65: change "E" to -- $\in$ --.

Column 9,
Line 35: after "$N_4$" insert -- ; --.
Line 45: after "$N_4$" insert -- ; --.

Column 11,
Line 58: change "ELD" to -- ILD --.
Line 62: after "$N_4$" insert -- , --.

Column 13,
Line 57: change "etchlinig" to -- etching --.

Column 14,
Line 17: change "Inlsulating to -- insulating --.
Line 19: change "dimenisional" to -- dimensional --.
Line 27: change "patteriling: to -- patterning --.
Line 36: change "g,roup" to -- group --.
Line 41: after "is" delete "are".
Line 43: change "diy" to -- dry --.

UNITED STATES PATENT AND TRADEMARK OFFICE
CERTIFICATE OF CORRECTION

PATENT NO. : 5,976,928
DATED : November 2, 1999
INVENTOR(S) : Peter S. Kirlin and Peter C. Van Buskirk It is certified that error appears in the above-identified patent and that said Letters Patent is hereby corrected as shown below:

Column 15,
Line 5: change ",roup" to -- group --.

Column 16,
Line 4: after "mixtures" insert -- thereof --.
Line 38: change "forn" to -- form --.
Line 44: change "inisulating" to -- insulating --.
Line 46: change "trncli" to -- trench --.
Line 60: change "conforinally" to -- conformally --.
Line 62: change "patterinig" to -- patterning --.
Line 62: change "complimeni-" to -- complimen- --.

Column 17,
Line 10: after "dielectric" delete "insulating".
Line 12: after "dielectric" delete "insulating"

Column 18,
Line 36-37: after: "metalization" insert -- layer --.
Line 38-39: after "metalization" insert -- layer --.

Signed and Sealed this

Twenty-seventh Day of November, 2001

Attest:

NICHOLAS P. GODICI
Attesting Officer
Acting Director of the United States Patent and Trademark Office